United States Patent
Shiraishi (10) Patent No.: US 12,342,572 B2
(45) Date of Patent: Jun. 24, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Tatsuya Shiraishi, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 477 days.

(21) Appl. No.: 17/903,894

(22) Filed: Sep. 6, 2022

(65) Prior Publication Data

US 2023/0307537 A1    Sep. 28, 2023

(30) Foreign Application Priority Data

Mar. 22, 2022 (JP) ................. 2022-045399

(51) Int. Cl.
*H01L 29/78* (2006.01)
*H10D 30/66* (2025.01)
(Continued)

(52) U.S. Cl.
CPC ......... *H10D 30/668* (2025.01); *H10D 64/117* (2025.01); *H10D 64/513* (2025.01); *H10D 64/516* (2025.01)

(58) Field of Classification Search
None
See application file for complete search history.

(56) References Cited

U.S. PATENT DOCUMENTS

| 8,981,470 B2 | 3/2015 | Nozu |
| 2014/0209999 A1 | 7/2014 | Sato et al. |

(Continued)

FOREIGN PATENT DOCUMENTS

| JP | 2010-129973 A | 6/2010 |
| JP | 2014-060298 A | 4/2014 |

(Continued)

OTHER PUBLICATIONS

Office Action issued in Japanese Patent Application No. 2022-045399 dated Mar. 4, 2025 in 12 pages.

*Primary Examiner* — William C Trapanese
(74) *Attorney, Agent, or Firm* — Knobbe Martens Olson & Bear LLP (57) ABSTRACT

A semiconductor device of an embodiment includes a first electrode, a first semiconductor layer of first conductivity type provided on the first electrode; a second semiconductor layer of first conductivity type provided on the first semiconductor layer; a first semiconductor region of second conductivity type provided on the second semiconductor layer; a first insulating film provided in a trench reaching the second semiconductor layer from above the first semiconductor region, a dielectric constant of an upper part of the first insulating film being higher than a dielectric constant of a lower part of the first insulating film; a second electrode provided in the trench, the second electrode facing the first semiconductor region; and a second insulating film provided between the second electrode and the first semiconductor region, the second insulating film being provided on the first insulating film in the trench.

18 Claims, 12 Drawing Sheets

(51) Int. Cl.
*H10D 64/00* (2025.01)
*H10D 64/27* (2025.01)

(56) References Cited

U.S. PATENT DOCUMENTS

| | | | |
|---|---|---|---|
| 2017/0263767 A1 | 9/2017 | Nishiwaki | |
| 2018/0097061 A1 | 4/2018 | Mimura et al. | |
| 2019/0189756 A1 | 6/2019 | Okumura | |
| 2021/0296454 A1* | 9/2021 | Fujino | H10D 64/117 |
| 2021/0296490 A1* | 9/2021 | Shiraishi | H10D 30/0297 |

FOREIGN PATENT DOCUMENTS

| | | |
|---|---|---|
| JP | 2014-146666 A | 8/2014 |
| JP | 2016-181617 A | 10/2016 |
| JP | 2017-162909 A | 9/2017 |
| JP | 2019-106507 A | 6/2019 |
| JP | 2021-150401 A | 9/2021 |

\* cited by examiner

SEMICONDUCTOR DEVICE

CROSS-REFERENCE TO RELATED APPLICATION

This application is based upon and claims the benefit of priority from Japanese Patent Application No. 2022-045399, filed on Mar. 22, 2022, the entire contents of which are incorporated herein by reference.

FIELD

Embodiments described herein relate generally to semiconductor device.

BACKGROUND

Semiconductor devices such as a MOSFET (Metal Oxide Semiconductor Field Effect Transistor) are used in applications for power conversion. Such a semiconductor device preferably has a high withstand voltage.

DETAILED DESCRIPTION

Hereinafter, embodiments of the present disclosure will be described with reference to the drawings. In the following description, the same members and the like are denoted by the same reference numerals, and the description of the members and the like once described is appropriately omitted.

Here, upward in the drawings is described as "up", and downward in the drawings is described as "down" in order to indicate a positional relationship of parts and the like. In this specification, the conceptuals "up" and "down" are not necessarily terms indicating a relationship with the direction of gravity.

Hereinafter, a case where a first conductivity type is n-type and a second conductivity type is p-type will be exemplified.

In the following description, when there are notations of $n^+$, $n$, $n^-$, $p^+$, $p$, and $p^-$, these indicate the relative high and low of the impurity concentration in each conductivity type. That is, $n^+$ indicates that the n-type impurity concentration is relatively higher than n, and n− indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

Embodiments

The semiconductor device of the embodiment includes a first electrode, a first semiconductor layer of first conductivity type provided on the first electrode; a second semiconductor layer of first conductivity type provided on the first semiconductor layer; a first semiconductor region of second conductivity type provided on the second semiconductor layer; a first insulating film provided in a trench reaching the second semiconductor layer from above the first semiconductor region, a dielectric constant of an upper part of the first insulating film being higher than a dielectric constant of a lower part of the first insulating film; a second electrode provided in the trench, the second electrode facing the first semiconductor region; a second insulating film provided between the second electrode and the first semiconductor region, the second insulating film being provided on the first insulating film in the trench; a second semiconductor region of first conductivity type provided on the first semiconductor region; an interlayer insulating film provided on the second electrode; and a third electrode provided on the interlayer insulating film, the third electrode being electrically connected to the second semiconductor region.

Figure 1:
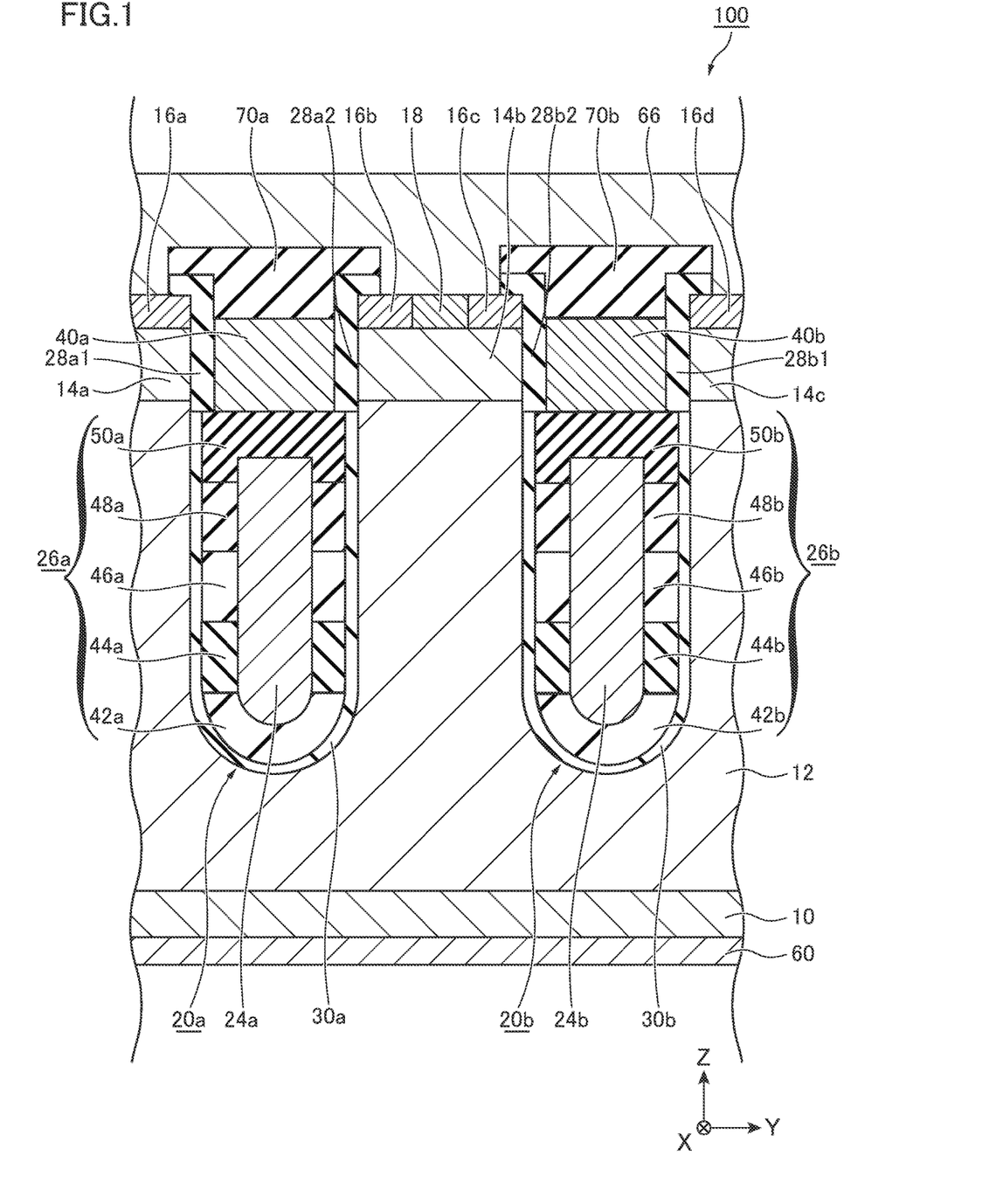
FIG. 1 is a schematic cross-sectional view of a semiconductor device according to an embodiment.

FIG. 1 is a schematic cross-sectional view of a semiconductor device 100 of the embodiment. The semiconductor device 100 is, for example, a vertical MOSFET.

The semiconductor device 100 includes a drain layer 10, a drift layer 12, a base region 14, a source region 16, a contact region 18, a trench 20, a field plate electrode 24, a first insulating film 26, a gate insulating film 28, a HDP protection film 30, a gate electrode 40, a drain electrode 60, a source electrode 66 and an interlayer insulating film 70.

Note that the drain layer 10 is an example of the first semiconductor layer. The drift layer 12 is an example of the second semiconductor layer. The base region 14 is an example of the first semiconductor region. The source region 16 is an example of the second semiconductor region. The gate insulating film 28 is an example of the second insulating film. The HDP protection film 30 is an example of the third insulating film. The gate electrode 40 is an example of the second electrode. The drain electrode 60 is an example of the first electrode. The source electrode 66 is an example of the third electrode.

The drain layer 10 functions as a drain of the MOSFET. The drain layer 10 includes, for example, an $n^+$-type semiconductor material.

The drain electrode 60 is provided under the drain layer 10 and is electrically connected to the drain layer 10.

The drift layer 12 is provided on the drain layer 10. The drift layer 12 includes, for example, an n⁻-type semiconductor material.

Here, an X direction, a Y direction perpendicular to the X direction, and a Z direction perpendicular to the X direction and the Y direction are defined. The drain layer 10 and the drift layer 12 are provided parallel to an XY plane parallel to the X direction and the Y direction. The Z direction is a direction in which the drain layer 10 and the drift layer 12 are stacked. FIG. 1 is a schematic cross-sectional view of a semiconductor device 100 in the YZ plane.

The base region 14 is provided on the drift layer 12. The base region 14 is a region that forms a channel when a voltage is applied to the gate electrode 40, which enables carriers to flow between the source region 16 and the drain layer 10. The base region 14 contains, for example, a p-type semiconductor material. The semiconductor device 100 has a base region 14a, 14b and 14c.

The source region 16 is provided on the base region 14. Carriers flow between the source region 16 and the drain layer 10 when appropriate voltages are applied to the gate electrode 40. The source region 16 includes, for example, an n⁺-type semiconductor material. The semiconductor device 100 has a source region 16a, 16b, 16c and 16d.

The contact region 18 is provided on the base region 14 and is electrically connected to the base region 14 and the source region 16. The contact region 18 is provided to improve the electrical contacts between the base region 14 and the source electrode 66. The contact region 18 may include, for example, a p⁺-type semiconductor material.

The trench 20 is provided so as to reach the drift layer 12 from above the base region 14. The semiconductor device 100 has a trench 20a and a trench 20b.

The first insulating film 26 is provided in the trench 20 to face the drift layer 12. However, the form of the first insulating film 26 is not limited to this form. For example, the first insulating film 26 is formed by an HDP-CVD (High Density Plasma-Chemical Vapor Deposition) method, for example. The first insulating film 26a is provided in the trench 20a. The first insulating film 26b is provided in the trench 20b.

Here, the first insulating film 26 has a first insulating portion 42, a second insulating portion 44, a third insulating portion 46, a fourth insulating portion 48, and a fifth insulating portion 50. The second insulating portion 44 is provided on the first insulating portion 42. The third insulating portion 46 is provided on the second insulating portion 44. The fourth insulating portion 48 is provided on the third insulating portion 46. The fifth insulating portion 50 is provided on the fourth insulating portion 48. In other words, in the trench 20, in order from the bottom to the top, or from below to above, the first insulating portion 42, the second insulating portion 44, the third insulating portion 46, the fourth insulating portion 48 and the fifth insulating portion 50 are provided.

The dielectric constant of first insulating film 26 is preferably increased from below to above. In other words, the dielectric constant of the first insulating film 26 preferably decreases from above to below. For this reason, in the semiconductor device 100 of the embodiment, the dielectric constant of the second insulating portion 44 is higher than the dielectric constant of the first insulating portion 42. The dielectric constant of the third insulating portion 46 is higher than the dielectric constant of the second insulating portion 44. The dielectric constant of the fourth insulating portion 48 is higher than the dielectric constant of the third insulating portion 46. The dielectric constant of the fifth insulating portion 50 is higher than the dielectric constant of the fourth insulating portion 48.

Incidentally, the first insulating film 26 may not include the first insulating portion 42, the second insulating portion 44, the third insulating portion 46, the fourth insulating portion 48, and the fifth insulating portion 50. For example, the dielectric constant of the first insulating film 26 may be increased from below to above by continuously changing the composition of the first insulating film 26.

Further, HDP (High Density Plasma) insulating film 30 is provided between the first insulating film 26 (the first insulating portion 42, the second insulating portion 44, the third insulating portion 46, the fourth insulating portion 48, and the fifth insulating portion 50) and the drift layer 12.

A field plate electrode 24 is also provided in the first insulating film 26 of the trench 20. For example, if the first insulating film 26 has the first insulating portion 42, the second insulating portion 44, the third insulating portion 46, the fourth insulating portion 48, and the fifth insulating portion 50, the lower end of field plate electrode 24 is provided in the first insulating portion 42. Then, the upper end of the field plate electrode 24 is provided in the fifth insulating portion 50.

Hereinafter, the first insulating portion 42, the second insulating portion 44, the third insulating portion 46, the fourth insulating portion 48, the fifth insulating portion 50, the HDP protection film 30 and the field plate electrode 24 will be described.

The first insulating portion 42 is provided at the lowest part of the trench 20. The first insulating portion 42 is preferably a silicon-oxide film. The first insulating portion 42 is preferably a SiOF film (fluorine-doped silicon oxide film). However, the first insulating portion 42 is not limited to a silicon oxide film or a SiOF film. The first insulating portion 42a is provided in the trench 20a. The first insulating portion 42b is provided in the trench 20b.

The fifth insulating portion 50 is provided in the trench 20 above the first insulating portion 42. The fifth insulating portion 50 is preferably a silicon nitride film (SiN film). However, the fifth insulating portion 50 is not limited to a silicon nitride film. The fifth insulating portion 50a is provided in the trench 20a. The fifth insulating portion 50b is provided in the trench 20b.

For example, if the first insulating portion 42 is a silicon oxide film or a SiOF film, and if the fifth insulating portion 50 is a silicon nitride film, the dielectric constant of an upper part of the first insulating film 26 is higher than the dielectric constant of a lower part of the first insulating film 26.

The second insulating portion 44 is provided between the first insulating portion 42 and the fifth insulating portion 50. The second insulating portion 44a is provided in the trench 20a. The second insulating portion 44b is provided in the trench 20b.

The third insulating portion 46 is provided between the second insulating portion 44 and the fifth insulating portion 50. The third insulating portion 46a is provided in the trench 20a. The third insulating portion 46b is provided in the trench 20b.

The fourth insulating portion 48 is provided between the third insulating portion 46 and the fifth insulating portion 50. The fourth insulating portion 48a is provided in the trench 20a. The fourth insulating portion 48b is provided in the trench 20b.

It is preferable that the dielectric constant of the second insulating portion 44 is higher than the dielectric constant of the first insulating portion 42, and lower than the dielectric constant of the fifth insulating portion 50. It is preferable that the dielectric constant of the third insulating portion 46 is higher than the dielectric constant of the second insulating portion 44, and lower than the dielectric constant of the fifth insulating portion 50. It is preferable that the dielectric constant of the fourth insulating portion 48 is higher than the dielectric constant of the third insulating portion 46, and lower than the dielectric constant of the fifth insulating portion 50.

For example, it is preferable that the second insulating portion 44, the third insulating portion 46, and the fourth insulating portion 48 are SiON films (silicon oxynitride films). For example, it is preferable that the nitrogen concentration of the third insulating portion 46 be higher than the nitrogen concentration of the second insulating portion 44, and the nitrogen concentration of the fourth insulating portion 48 be higher than the nitrogen concentration of the third insulating portion 46. Because, thereby, the dielectric constant of the second insulating portion 44 can be higher than the dielectric constant of the first insulating portion 42 and lower than the dielectric constant of the fifth insulating portion 50. Further, because, thereby, the dielectric constant of the third insulating portion 46 can be higher than the dielectric constant of the second insulating portion 44 and lower than the dielectric constant of the fifth insulating portion 50. Further, because, thereby, the dielectric constant of the fourth insulating portion 48 can be higher than the dielectric constant of the third insulating portion 46 and lower than the dielectric constant of the fifth insulating portion 50.

The gate electrode 40 is provided on the fifth insulating portion 50 in the trench 20, and the gate electrode 40 faces the base region 14. For example, the gate electrode 40 is in contact with the fifth insulating portion 50. However, the gate electrode 40 may not be in contact with the fifth insulating portion 50. The gate electrode 40 functions as a gate of the MOSFET.

The gate insulating film 28 is provided between the gate electrode 40 and the base region 14, and the gate insulating film 28 is provided on the fifth insulating portion 50 (first insulating film 26) in the trench 20. The film thickness of the gate insulating film 28 in Y direction is thinner than the film thickness of the first insulating film 26 in the Y direction. The gate insulating film 28 $a_1$ and the gate insulating film $28a_2$ are provided in the trench 20a. The gate insulating film 28b1 and the gate insulating film $28b_2$ are provided in the trench 20b. The gate insulating film 28 functions as a gate insulating film for MOSFET. The gate insulating film 28 includes, for example, silicon oxide.

In the above cases, the gate electrode 40 is in direct contact with the side surface of the gate insulating film 28 and the top surface of the fifth insulating portion 50.

The field plate electrode 24 is provided, for example, to change the electric field distribution in the drift layer in the trench depth direction flatly, and to increase the breakdown voltage. The field plate electrode 24 includes, for example, polysilicon including conductivity type impurities. The field plate electrode 24a is provided in the trench 20a. The field plate electrode 24b is provided in the trench 20b.

The HDP protection film 30 is provided between the first insulating film 26 and the drift layer 12, and the HDP protection film is provided below the gate insulating film 28 in the trench 20. The HDP protection film 30 is a film for protecting the source region 16 and the base region 14, when the first insulating film 26 is formed, so that the source region 16 and the base region 14 are not damaged. The HDP protection film 30a is provided so as to cover the inner surface of the trench 20a. The first insulating film 26a is formed along a surface of the HDP protection film 30a. The HDP protection film 30b is provided so as to cover the inner surface of the trench 20b. The first insulating film 26b is formed along a surface of the HDP protection film 30b. The HDP protection film 30 includes, for example, silicon oxide.

The interlayer insulating film 70 is provided on the source region 16, the gate electrode 40 and the gate insulating film 28. The interlayer insulating film 70 includes, for example, silicon oxide.

The source electrode 66 is provided on the source region 16, the contact region 18, the gate insulating film 28 and the interlayer insulating film 70. Incidentally, the source electrode 66 is electrically insulated from the gate electrode 40 by the interlayer insulating film 70.

Examples of a semiconductor material used for the drain layer 10, the drift layer 12, the base region 14, and the source region 16 include silicon (Si). However, the semiconductor material used for the drain layer 10, the drift layer 12, the base region 14, and the source region 16 may be another semiconductor material such as silicon carbide (SiC), gallium nitride (GaN), or gallium arsenide (GaAs).

When Si is used as the semiconductor material, for example, arsenic (As), phosphorus (P), or antimony (Sb) can be used as n-type impurities, and boron (B) can be used as p-type impurities.

The field plate electrode 24 and the gate electrode 40 include a conductive material such as, for example, polysilicon containing conductivity type impurities.

The drain electrode 60 and the source electrode 66 include a conductive material such as, for example, Al.

Figure 2:
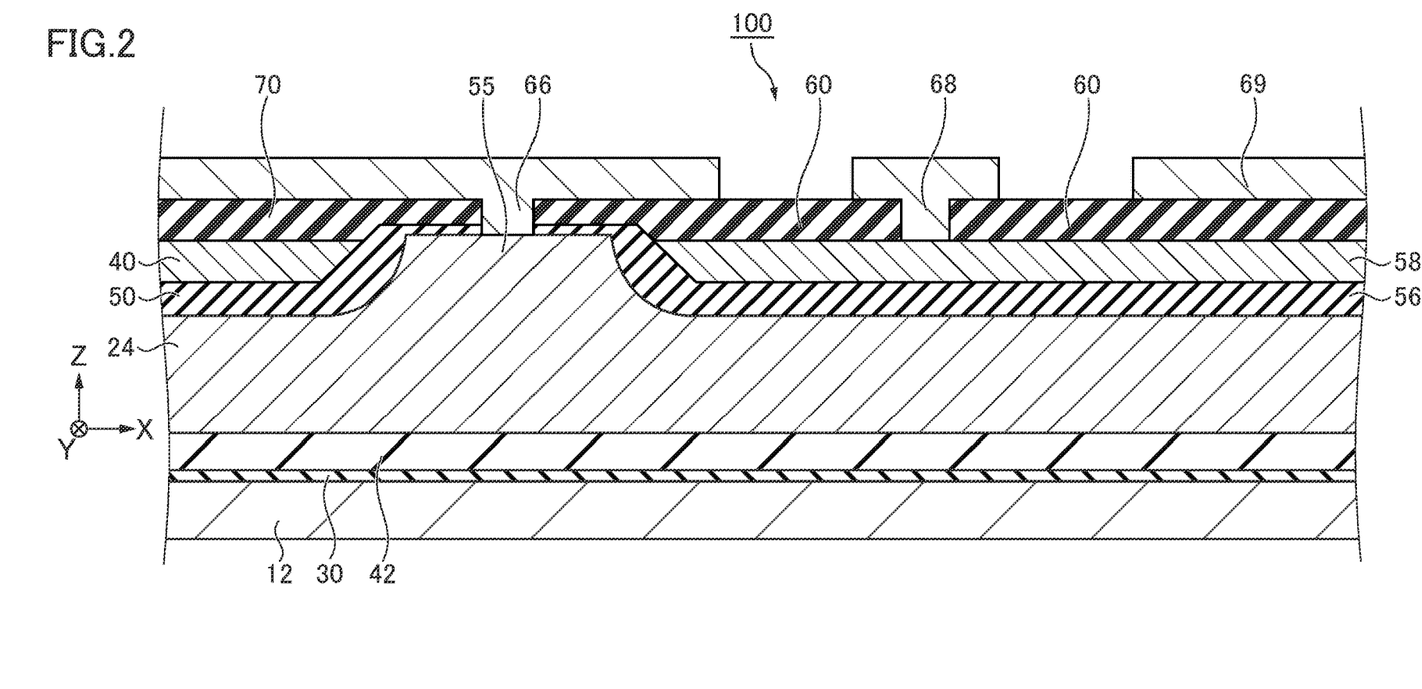
FIG. 2 is a schematic sectional view of a main portion of the semiconductor device of the embodiment.

FIG. 2 is a schematic sectional view of a main portion of the semiconductor device 100 of the embodiment. FIG. 2 is a schematic cross-sectional view of the semiconductor device 100 in an XZ plane passing through the field plate electrode 24. Incidentally, the illustration of the drain layer 10 and the drain electrode 60 is omitted.

The field plate electrode 24 has an upwardly extending section 55. The field plate electrode 24 is electrically connected to a portion of the source electrode 66 using the upwardly extending portion 55. As a result, the field plate electrode 24 is electrically connected to the source electrode 66. The form of the electric connection between the field plate electrode 24 and the source electrode 66 is not limited to this.

Figure 3:
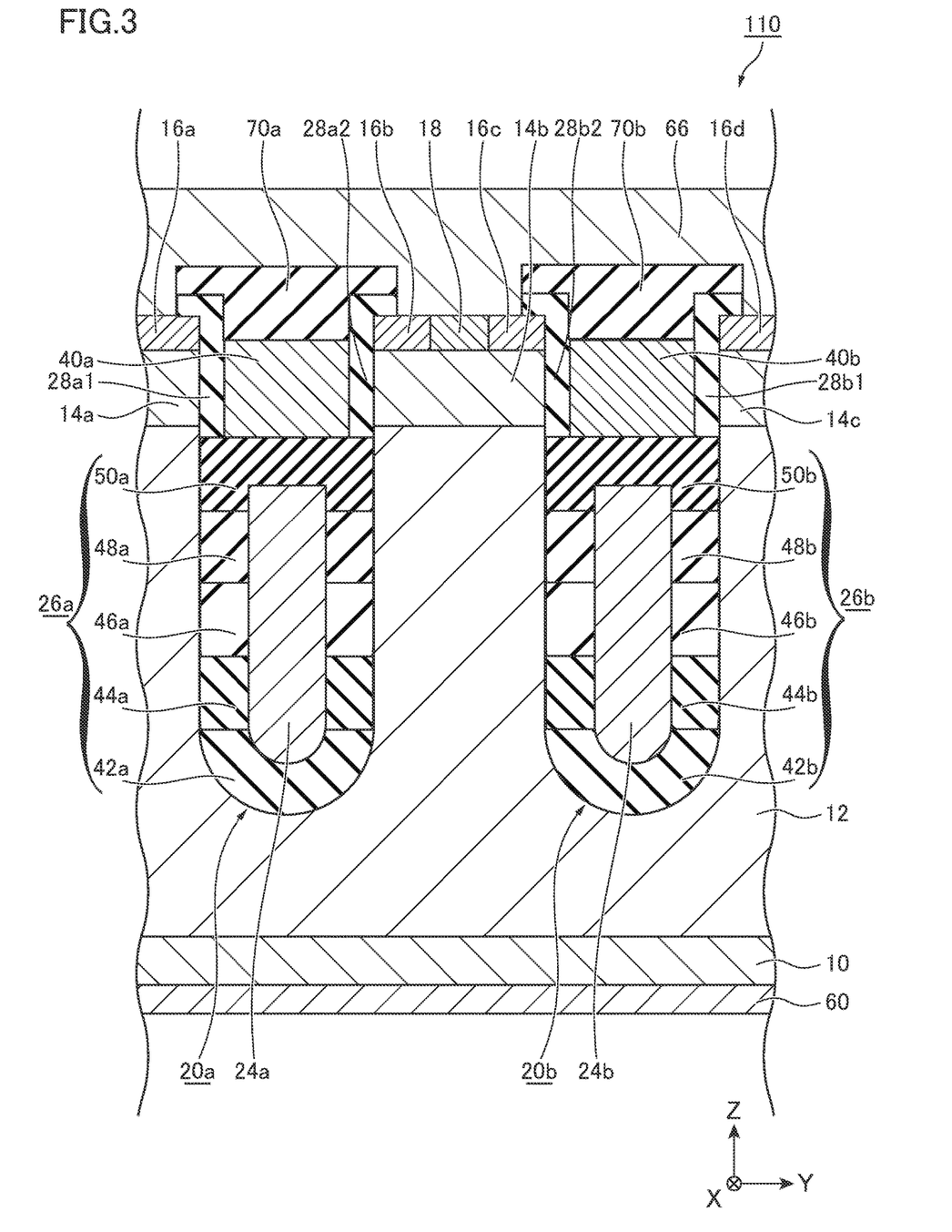
FIG. 3 is a schematic cross-sectional view of a semiconductor device according to another aspect of the embodiment.

FIG. 3 is a schematic cross-sectional view of a main portion of the semiconductor device 110 of another aspect of the embodiment. In the semiconductor device 110, unlike the semiconductor device 100, the HDP protection film 30 is not provided. The HDP protection film 30 may not be provided.

Figure 4:
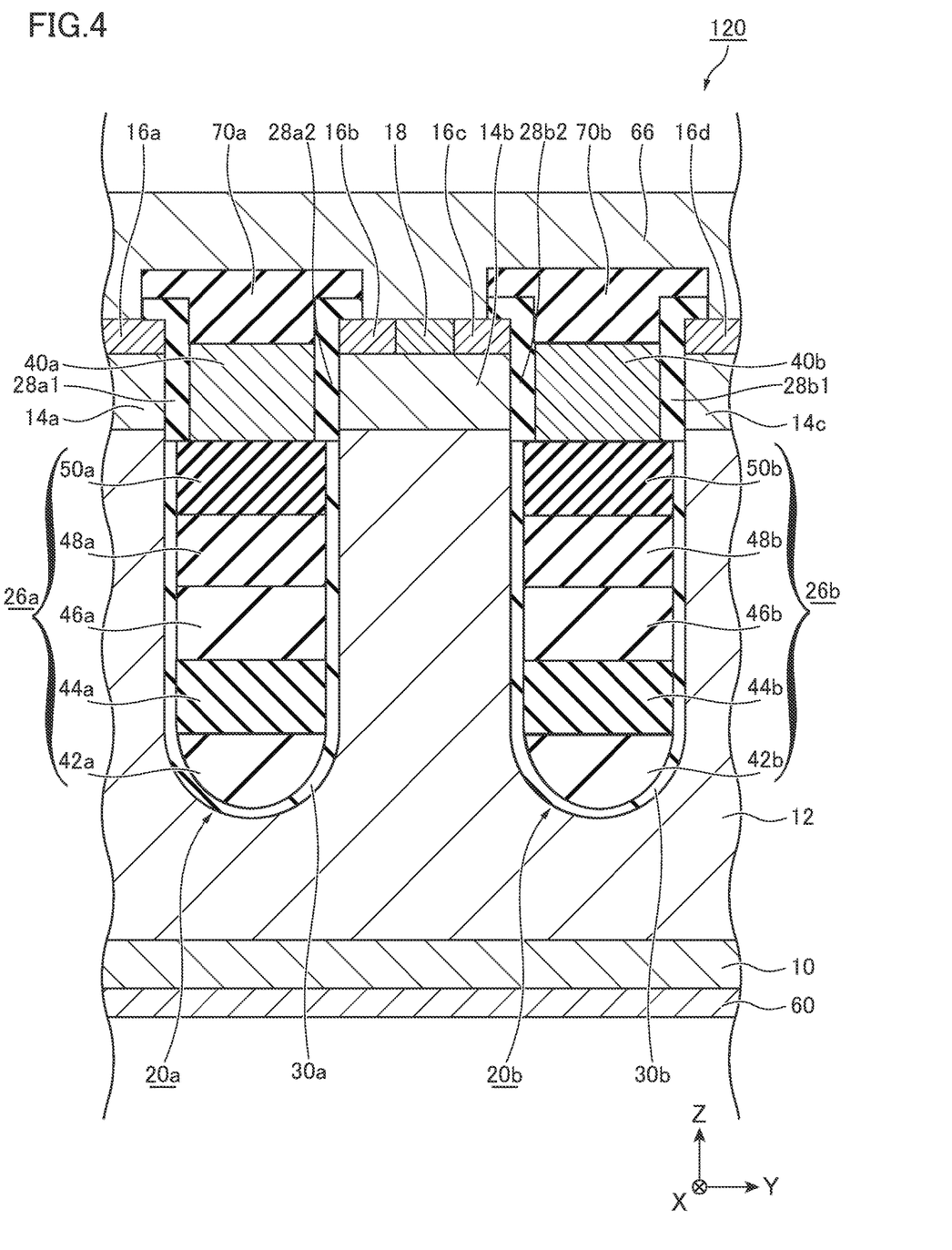
FIG. 4 is a schematic cross-sectional view of a semiconductor device according to another aspect of the embodiment.

FIG. 4 is a schematic cross-sectional view of a main portion of the semiconductor device 120 of another aspect of the embodiment. In the semiconductor device 120, unlike the semiconductor device 100, the field plate electrode 24 is not provided. The field plate electrode 24 is replaced by the first insulating portion 42, the second insulating portion 44, the third insulating portion 46, the fourth insulating portion 48 and the fifth insulating portion 50. Thus, the field plate electrode 24 may not be provided.

Figure 5:
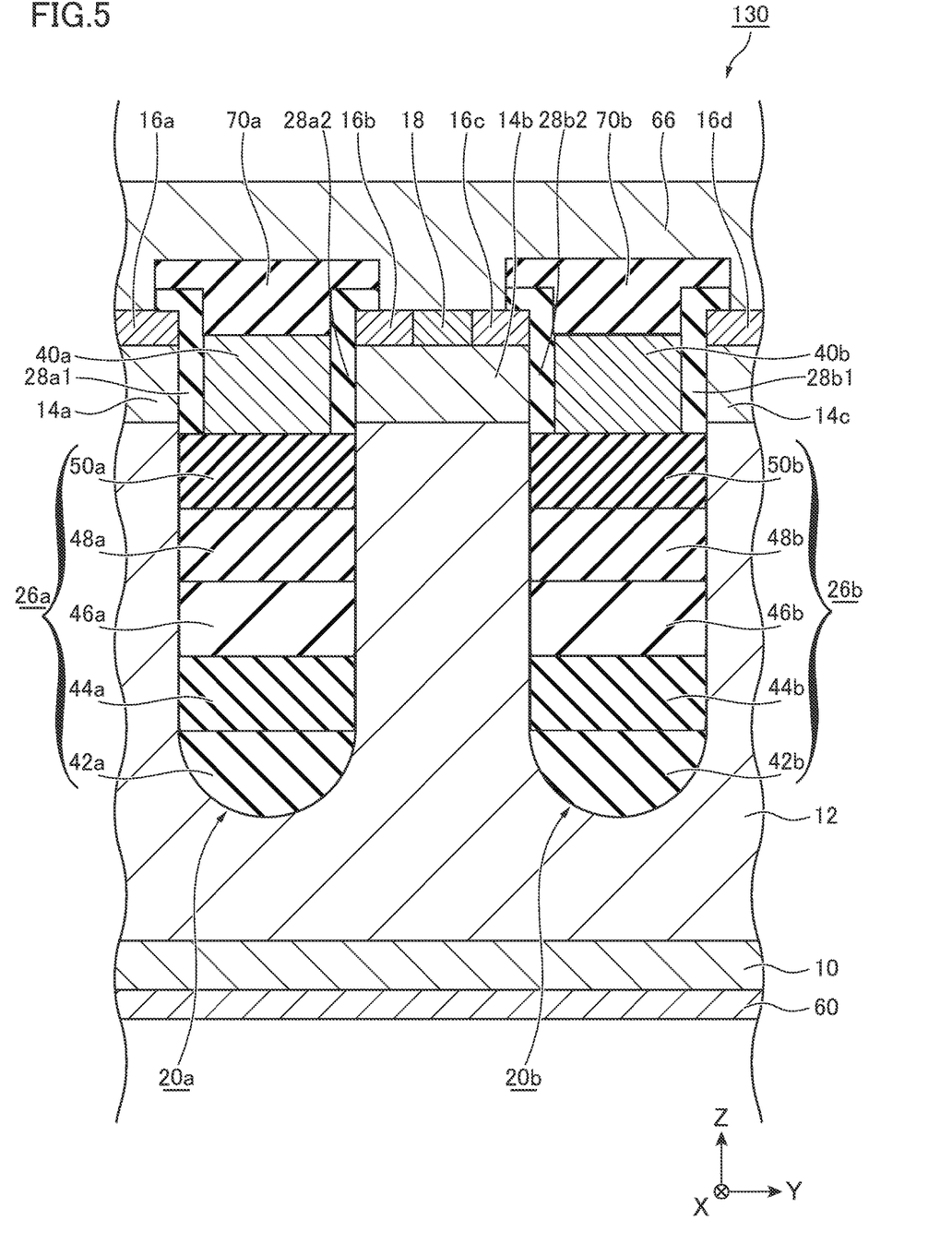
FIG. 5 is a schematic cross-sectional view of a semiconductor device according to another aspect of the embodiment.

FIG. 5 is a schematic cross-sectional view of a main portion of the semiconductor device 130 of another aspect of the embodiment. In the semiconductor device 130, unlike the semiconductor device 110, the field plate electrode 24 is not provided. The field plate electrode 24 is replaced by the first insulating portion 42, the second insulating portion 44, the third insulating portion 46, the fourth insulating portion 48 and the fifth insulating portion 50. Thus, the field plate electrode 24 may not be provided.

FIG. 6 to FIG. 10 are schematic cross-sectional views showing a manufacturing process of the semiconductor device of the embodiment.

Figure 6:
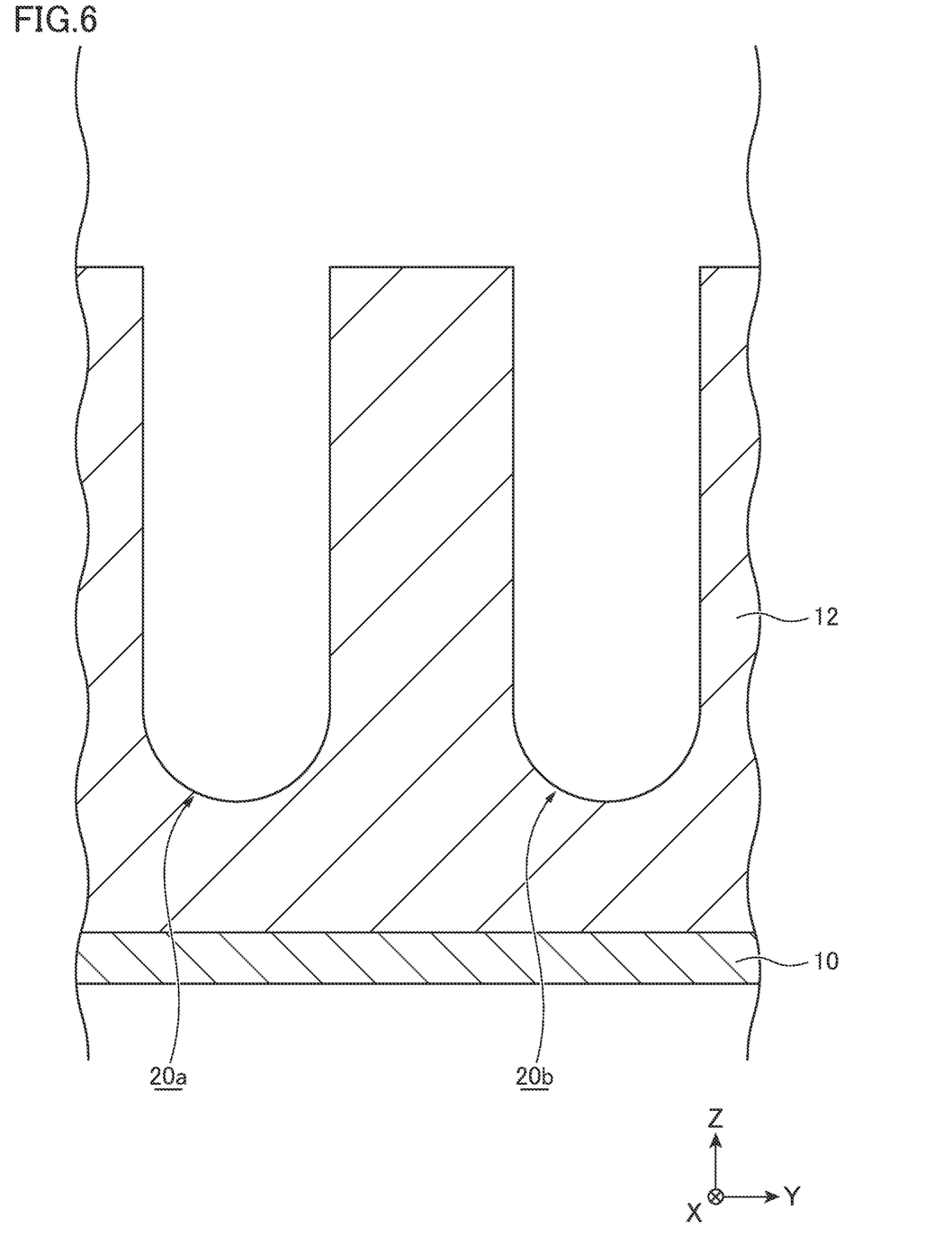
FIG. 6 is a schematic cross-sectional view illustrating a process of manufacturing the semiconductor device according to the embodiment.

First, the drift layer 12 is formed on the drain layer 10. For example, the drain layer 10 is used as a semiconductor substrate which is a Si substrate, and the drift layer 12 is formed on the drain layer 10 by epitaxial growth. However, the process of manufacturing the drain layer 10 and the drift layer 12 is not limited to the above manufacturing process. Next, the trench 20 reaching the drift layer 12 is formed using, for example, photolithography and RIE (Reactive Ion Etching) (FIG. 6).

Figure 7:
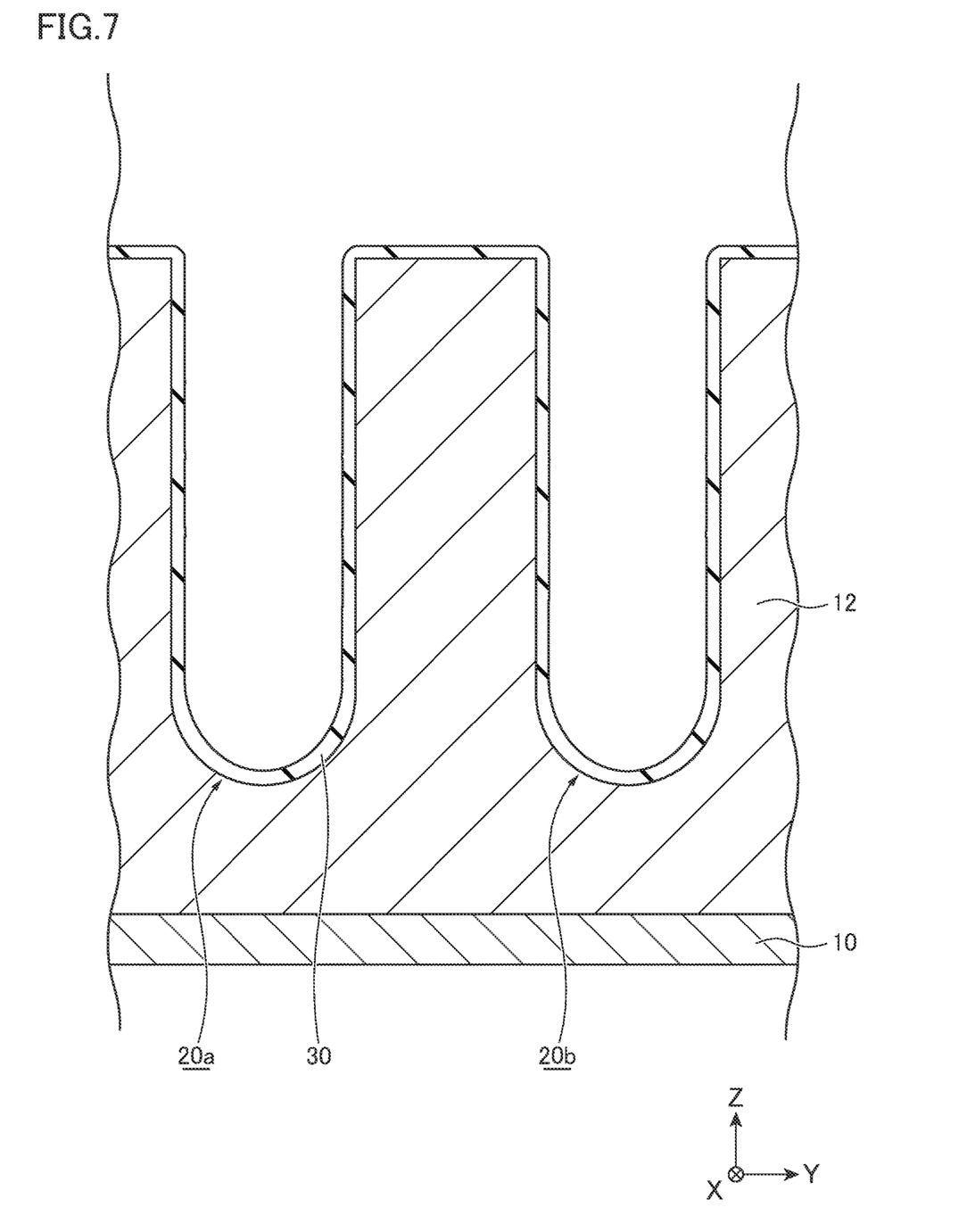
FIG. 7 is a schematic cross-sectional view illustrating a process of manufacturing the semiconductor device according to the embodiment.

Next, a thermal oxide film is formed on the upper surface of the drift layer 12 and the inner wall of the trench 20. Then, the thermal oxide film is peeled off (not shown). Next, the HDP protection film 30 including silicon oxide is formed on the upper surface of the drift layer 12 and the inner wall of the trench 20 by, for example, plasma CVD (Chemical Vapor Deposition) (FIG. 7).

Figure 8:
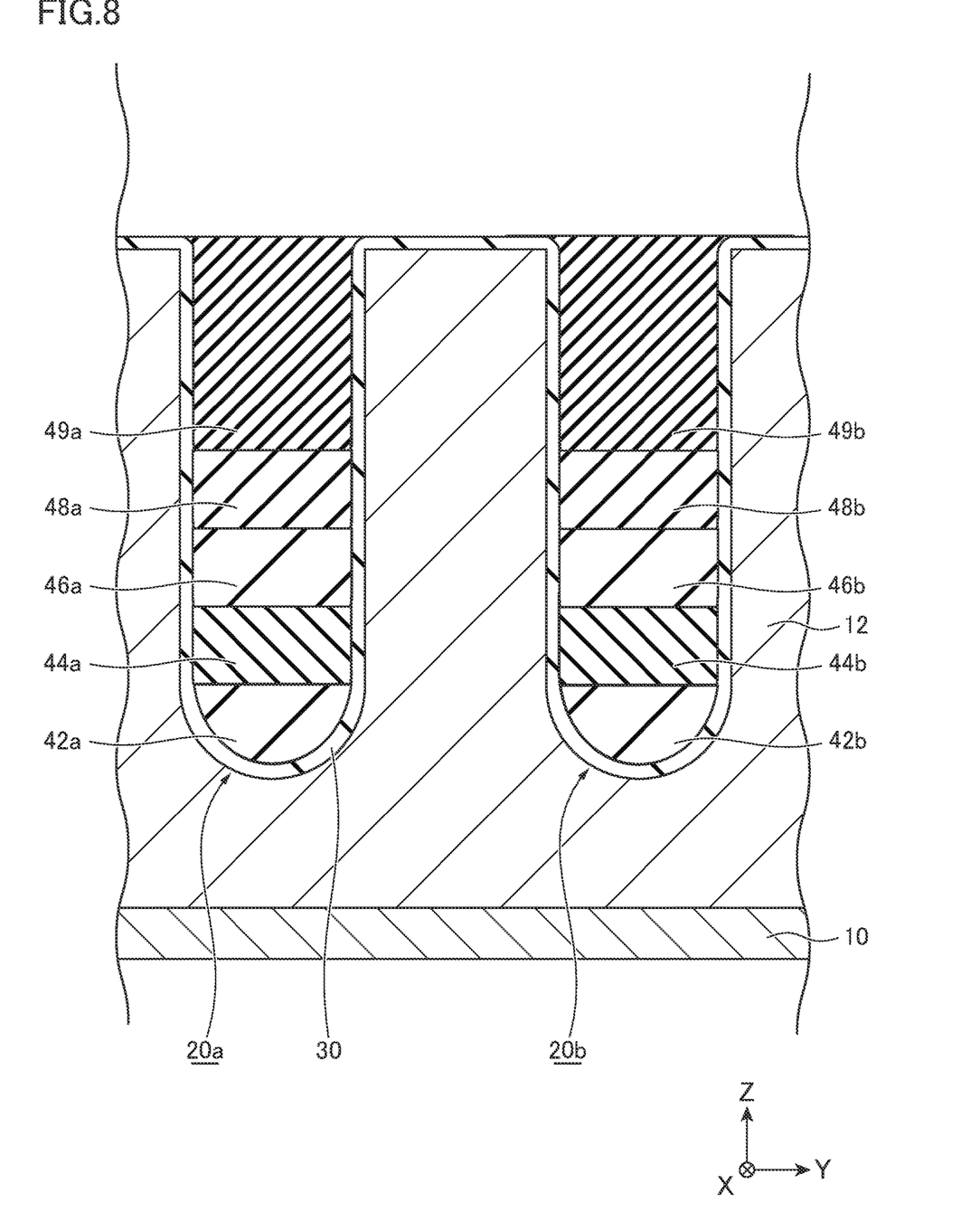
FIG. 8 is a schematic cross-sectional view illustrating a process of manufacturing the semiconductor device according to the embodiment.

Next, the first insulating portion 42, the second insulating portion 44, the third insulating portion 46, the fourth insulating portion 48, and the insulating film 49 are sequentially formed in the trench 20 by, for example, HDP-CVD (High Density Plasma-Chemical Vapor Deposition) method. Next, the upper surface of the insulating film 49 is flattened by, e.g., CMP (Chemical Mechanical Polishing) (FIG. 8). Here, the insulating film 49 is an insulating film that becomes a part of the fifth insulating portion 50. The insulating film 49a is formed in the trench 20a. The insulating film 49b is formed in the trench 20b.

Here, when the first insulating portion 42 is a silicon oxide film, the source gases used to form the first insulating portion 42 are, for example, $SiH_4$ and $N_2O$ gases, or $SiH_4$ and $O_2$ gases. When the first insulating portion 42 is a SiOF film, for example, $NF_3$ gas, $CF_4$ gas, $C_2F_6$ gas, or $SiF_4$ gas is preferably used to add F to the silicon oxide film.

When the second insulating portion 44, the third insulating portion 46, and the fourth insulating portion 48 are SiON films, the source gases used for forming the second insulating portion 44, the third insulating portion 46, and the fourth insulating portion 48 are, for example, $SiH_4$ gas, $N_2O$ gas, and $NH_3$ gas, or $SiH_4$ gas and $N_2O$ gas. When the nitrogen concentration in the insulating film is increased, for example, the nitrogen concentration of $N_2O$ gas or $NH_3$ gas in the source gas is increased.

When the fifth insulating portion 50 is a SiN film, the source gases used for forming fifth insulating portion 50 are, for example, $SiH_4$ gas and $NH_3$ gas.

Figure 9:
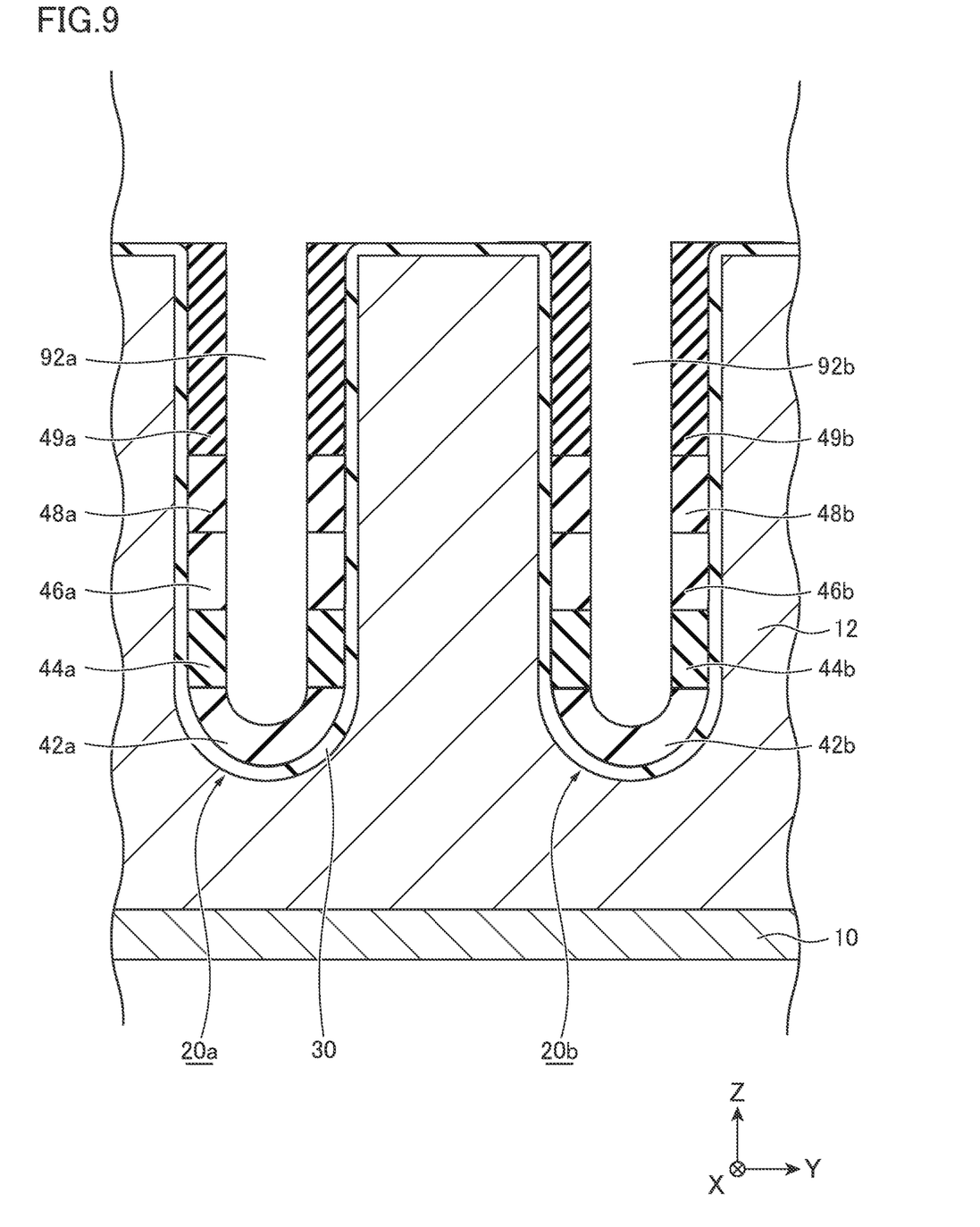
FIG. 9 is a schematic cross-sectional view illustrating a process of manufacturing the semiconductor device according to the embodiment.

Next, an opening 92 penetrating through the insulating film 49, the fourth insulating portion 48, the third insulating portion 46 and the second insulating portion 44, and reaching the first insulating portion 42, is formed in the trench 20, using, for example, photolithography and dry etching (FIG. 9). The opening 92a is formed in the trench 20a. The opening 92b is formed in the trench 20b.

Figure 10:
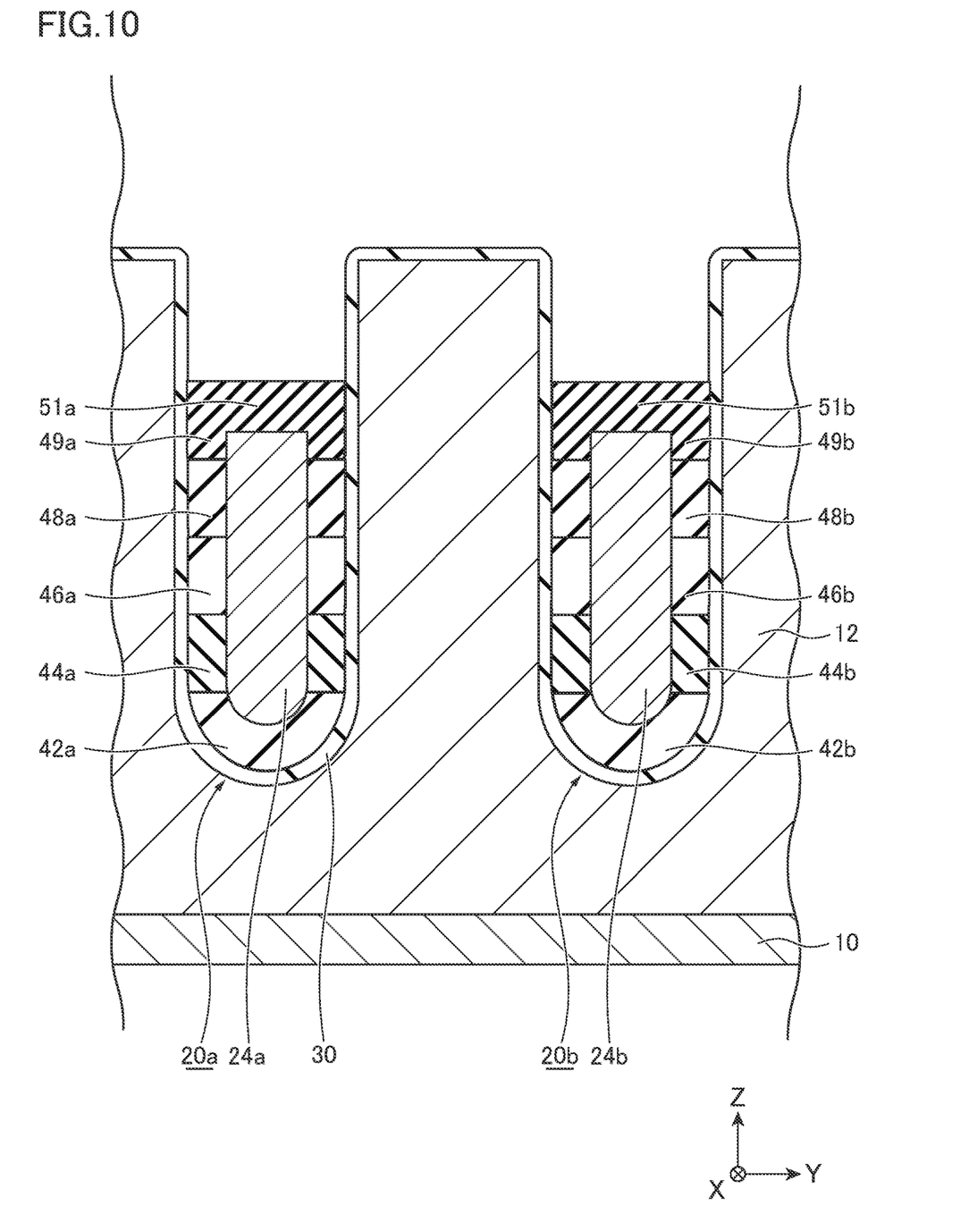
FIG. 10 is a schematic cross-sectional view illustrating a process of manufacturing the semiconductor device according to the embodiment.

Next, the field plate electrode 24, including polysilicon containing conductivity type impurities, is formed in the opening 92 using, for example, CVD and etchback. Next, the insulating film 51 containing, for example, the same materials as the insulating film 49, is formed on the field plate electrode 24 (FIG. 10). The insulating film 51a is formed in the trench 20a. The insulating film 51b is formed in the trench 20b. The insulating film 49 and the insulating film 51 is an insulating film to be the fifth insulating portion 50.

Next, the base region 14, the source region 16, the gate insulating film 28, the gate electrode 40, the interlayer insulating film 70, the source electrode 66 and the drain electrode 60 are appropriately formed to obtain the semiconductor device 100 of the embodiment.

Next, the operation and effect of the semiconductor device of the embodiment will be described.

Figure 11:
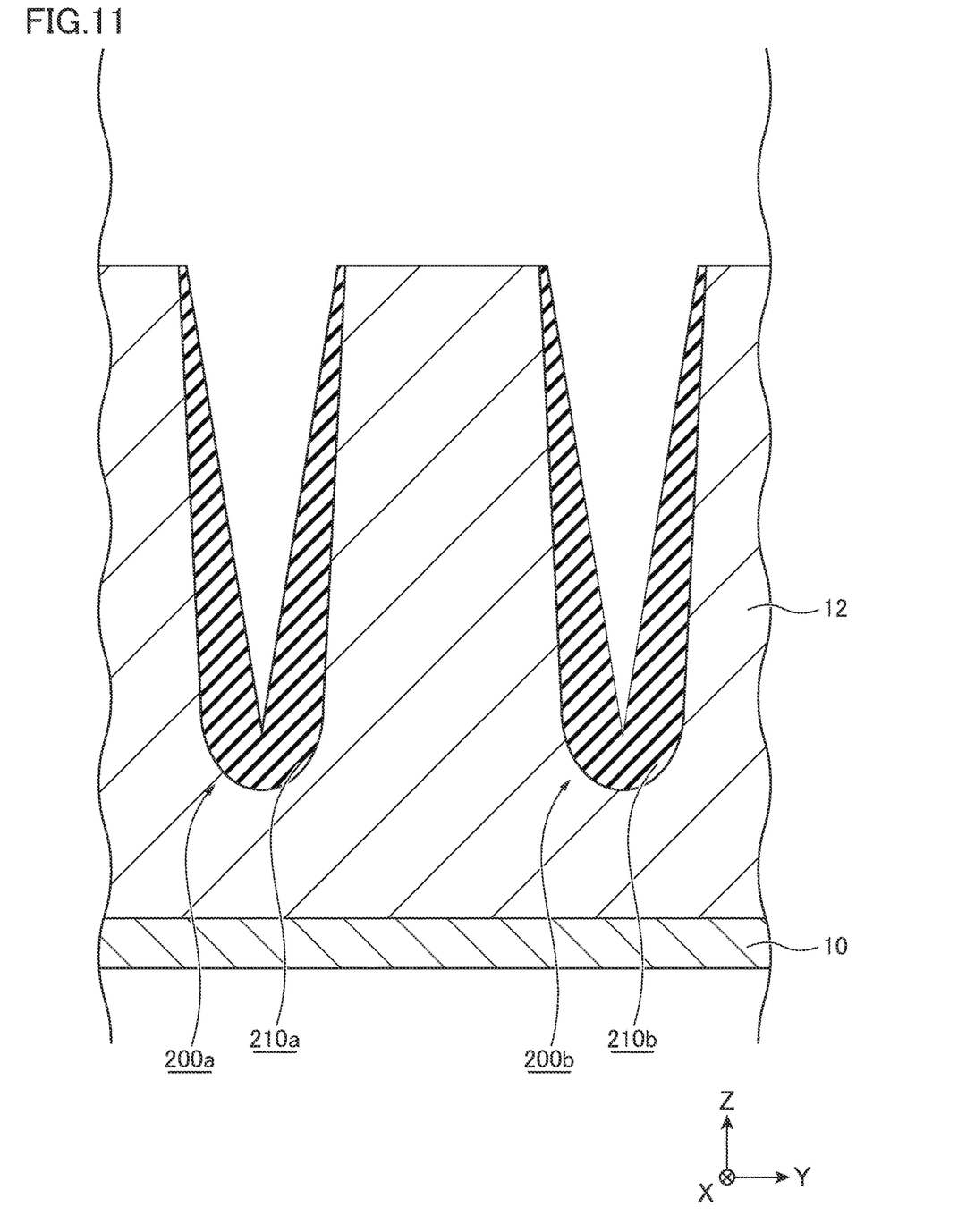
FIG. 11 is a schematic sectional view of a main portion of the semiconductor device as a comparative embodiment.

FIG. 11 is a schematic sectional view of a main portion of the semiconductor device as a comparative embodiment of the embodiment.

In a trench 200, an insulating film 210 is formed. The film thickness of the insulating film 210 is thin in the upper part of the trench 200 and becomes thicker toward the lower part of the trench 200. An insulating film having such a shape is referred to as a "tilted field plate insulating film." In contrast, the insulating film in which the film thickness does not change particularly in the upper part and in the lower part of the trench is referred to as a "straight field plate insulating film".

Figure 12:
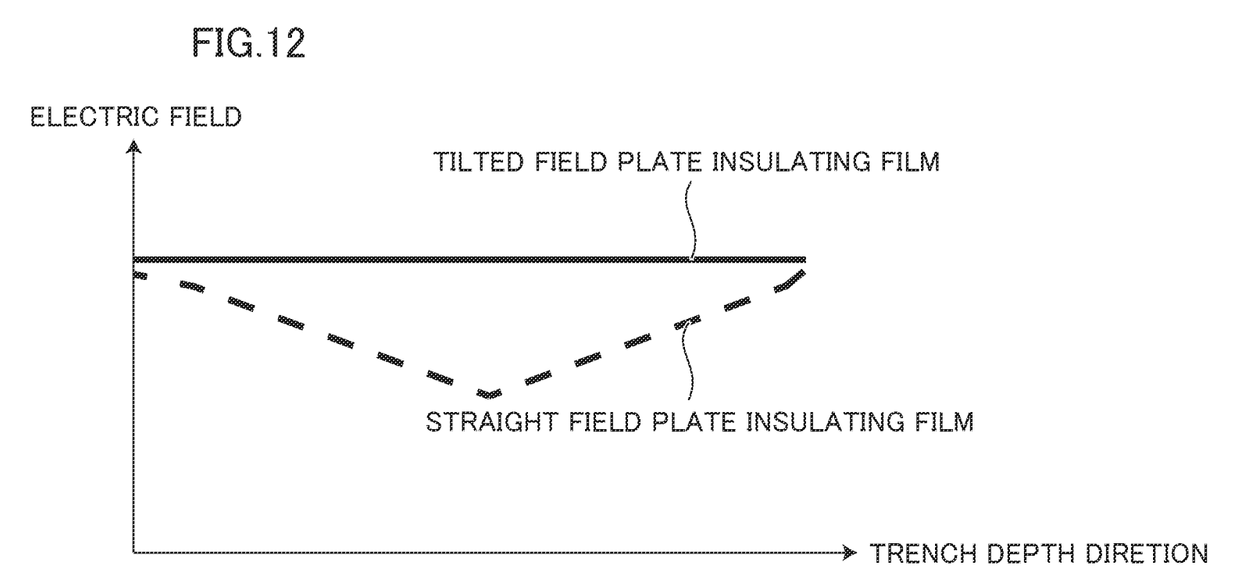
FIG. 12 is a schematic diagram for explaining a function and an effect of the semiconductor device according to the embodiment.

FIG. 12 is a schematic diagram for explaining the operation and effect of the semiconductor device of the embodiment. FIG. 12 is a schematic diagram showing the electric field in the trench depth direction in both the tilted field plate insulating film and the straight field plate insulating film. Incidentally, "trench depth direction" corresponds to, for example, in FIG. 1, the opposite direction of the Z direction. According to an intensive investigation by the present inventor, the straight field plate insulating film has a point where the electric field strength is lowered. On the other hand, in the case of the tilted field plate insulating film, compared to the straight field plate insulating film, the strength of the electric field does not change much along trench depth direction. Here, the breakdown voltage of the semiconductor device is determined by integrating the electric field in the trench depth direction. Therefore, by adopting the tilted field plate insulating film, it is possible to increase the breakdown voltage of the semiconductor device. Further, by adopting the tilted field plate insulating film, even when the n-type impurity concentration of the drift layer 12 is increased, it is possible to obtain an equivalent breakdown voltage, and it is considered that it is possible to reduce the drift resistance.

However, the tilted field plate insulating film has a change in the film thickness along trench depth direction. It is considered that it is difficult to stably produce such a shape with high reproducibility. Also, to create such shape, it is considered to increase the occupied area of the trench 20 in the drift layer 12 to ensure a change in the film thickness of the appropriate insulating film. However, in this case, it is considered that the on-resistance increases.

Therefore, the semiconductor device of the embodiment includes the first insulating film 26 provided in the trench reaching the drift layer 12 from above the base region 14, the first insulating film 26 faces the drift layer 12, and the dielectric constant of the upper part of the first insulating film is higher than the dielectric constant of the lower part of the first insulating film 26.

The equivalent oxide thickness of an insulating film is determined by (film thickness of the insulating film)×(dielectric constant of silicon oxide)/(dielectric constant of the insulating film). The higher the dielectric constant of the insulating film is, the thinner its equivalent oxide thickness is. Therefore, by increasing the dielectric constant of the upper part of the first insulating film more than the dielectric constant of the lower part of the first insulating film, the insulating film whose equivalent oxide film thickness is thinner in the upper part can be realized. Thus, considering the equivalent oxide film thickness, by the semiconductor device of the embodiment, it can be assumed that the semiconductor device having the tilted field plate insulating film described above can be realized. Therefore, by the semiconductor device of the embodiment, it is possible to provide a semiconductor device having a high breakdown voltage.

To increase the breakdown voltage of the semiconductor device, it is preferable to increase the difference in the dielectric constant between the lower part of the first insulating film 26 and the upper part of the first insulating film 26 as much as possible. The silicon oxide film or the SiOF film is preferably used as an insulating film having a low dielectric constant. The silicon oxide film or the SiOF film is preferably provided at the lowest part of the trench 20, for example, as the first insulating portion 42 included in the first insulating film 26. This is because the difference in dielectric constant can be made as large as possible.

The silicon nitride film is preferably used as an insulating film having a high dielectric constant. Such a silicon nitride film, for example, as the fifth insulating portion 50 included in the first insulating film 26, is preferably provided on the first insulating portion 42. This is because it is possible to increase the difference in dielectric constant as much as possible below and above first insulating film 26.

On the other hand, the gate insulating film is preferably a silicon oxide film. This is because the leakage current can be suppressed, and the reliability is high.

The second insulating portion 44, the third insulating portion 46 and the fourth insulating portion 48 are preferably SiON films. This is because an insulating film having a dielectric constant between the dielectric constant of the silicon oxide film and the dielectric constant of the SiN film can be easily formed.

According to the semiconductor device of the embodiment, it is possible to provide a semiconductor device having a high breakdown voltage.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode,
a first semiconductor layer of first conductivity type provided on the first electrode;
a second semiconductor layer of first conductivity type provided on the first semiconductor layer;
a first semiconductor region of second conductivity type provided on the second semiconductor layer;
a first insulating film provided in a trench reaching the second semiconductor layer from above the first semiconductor region, a dielectric constant of an upper part of the first insulating film being higher than a dielectric constant of a lower part of the first insulating film;
a second electrode provided in the trench, the second electrode facing the first semiconductor region;
a second insulating film provided between the second electrode and the first semiconductor region, the second insulating film being provided on the first insulating film in the trench;
a second semiconductor region of first conductivity type provided on the first semiconductor region;
an interlayer insulating film provided on the second electrode; and
a third electrode provided on the interlayer insulating film, the third electrode being electrically connected to the second semiconductor region.

2. The semiconductor device according to claim 1, wherein the first insulating film includes a first insulating portion, and the first insulating portion is a silicon oxide film.

3. The semiconductor device according to claim 2, wherein the first insulating portion is provided at the lowest part of the trench.

4. The semiconductor device according to claim 2, wherein the first insulating film includes a fifth insulating portion provided on the first insulating portion, and the fifth insulating portion is a silicon nitride film.

5. The semiconductor device according to claim 4, wherein the second electrode is in direct contact with the fifth insulating portion.

6. The semiconductor device according to claim 5, wherein the first insulating film further includes a second insulating portion provided between the first insulating portion and the fifth insulating portion, and the second insulating portion is a SiON film.

7. The semiconductor device according to claim 6, wherein the first insulating film further includes
a third insulating portion provided between the second insulating portion and the fifth insulating portion, the third insulating portion is a SiON film, and a nitrogen concentration of the third insulating portion is higher than a nitrogen concentration of the second insulating portion, and
a fourth insulating portion provided between the third insulating portion and the fifth insulating portion, the fourth insulating portion is a SiON film, and a nitrogen concentration of the fourth insulating portion is higher than the nitrogen concentration of the third insulating portion.

8. The semiconductor device according to claim 1, wherein the first insulating film includes a first insulating portion, and the first insulating portion is a SiOF film.

9. The semiconductor device according to claim 8, wherein the first insulating portion is provided at the lowest part of the trench.

10. The semiconductor device according to claim 8, wherein the first insulating film includes a fifth insulating portion provided on the first insulating portion, and the fifth insulating portion is a silicon nitride film.

11. The semiconductor device according to claim 10, wherein the second electrode is in direct contact with the fifth insulating portion.

12. The semiconductor device according to claim 11, wherein the first insulating film further includes a second insulating portion provided between the first insulating portion and the fifth insulating portion, and the second insulating portion is a SiON film.

13. The semiconductor device according to claim 6, wherein the first insulating film further includes
a third insulating portion provided between the second insulating portion and the fifth insulating portion, the third insulating portion is a SiON film, and a nitrogen concentration of the third insulating portion is higher than a nitrogen concentration of the second insulating portion, and a fourth insulating portion provided between the third insulating portion and the fifth insulating portion, the fourth insulating portion is a SiON film, and a nitrogen concentration of the fourth insulating portion is higher than the nitrogen concentration of the third insulating portion.

14. The semiconductor device according to claim 1, wherein the second insulating film is a silicon oxide film.

15. The semiconductor device according to claim 1, further comprising:
a third insulating film provided between the first insulating film and the second semiconductor layer, and the third insulating film being provided in the trench.

16. The semiconductor device according to claim 1, further comprising:
a field plate electrode provided in the first insulating film, and the field plate electrode being provided in the trench.

17. The semiconductor device according to claim 6, further comprising:
a field plate electrode provided in the first insulating film, and the field plate electrode being provided in the trench.

18. The semiconductor device according to claim 12, further comprising:
a field plate electrode provided in the first insulating film, and the field plate electrode being provided in the trench.

* * * * *